(12) United States Patent
Koh et al.

(10) Patent No.: US 10,688,437 B2
(45) Date of Patent: Jun. 23, 2020

(54) FILTER STRUCTURE FOR CHEMICAL SOLUTION USED IN MANUFACTURING INTEGRATED CIRCUIT AND APPARATUS FOR SUPPLYING CHEMICAL SOLUTION INCLUDING FILTER STRUCTURE FOR CHEMICAL SOLUTION

(71) Applicant: Samsung Electronics Co., Ltd., Suwon-si (KR)

(72) Inventors: Cha-won Koh, Yongin-si (KR); Oleg Feygenson, Hwaseong-si (KR); Jung-hyeon Kim, Yongin-si (KR); Hyun-woo Kim, Hanam-si (KR); Eun-sung Kim, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 69 days.

(21) Appl. No.: 16/122,454

(22) Filed: Sep. 5, 2018

(65) Prior Publication Data

US 2019/0232227 A1     Aug. 1, 2019

(30) Foreign Application Priority Data

Jan. 26, 2018    (KR) ..................... 10-2018-0009935

(51) Int. Cl.
     *B01D 61/42*      (2006.01)
     *G03F 7/26*      (2006.01)
     (Continued)

(52) U.S. Cl.
     CPC ........... *B01D 61/42* (2013.01); *B01D 61/422* (2013.01); *B01D 61/46* (2013.01); *B01D 63/06* (2013.01);
     (Continued)

(58) Field of Classification Search
     CPC ...... B01D 61/42; B01D 61/422; B01D 61/46; B01D 63/06; B01D 29/15; B01D 29/58; G03F 7/16; G03F 7/26; H01L 21/0273
     See application file for complete search history.

(56) References Cited

U.S. PATENT DOCUMENTS 5,128,041 A     7/1992    Degen et al.
6,851,561 B2    2/2005    Wu et al.
               (Continued)

FOREIGN PATENT DOCUMENTS

KR     10-2003-0006302    1/2003
KR     10-2008-0006262    1/2008
KR     10-0857995         9/2008

OTHER PUBLICATIONS

"Front Matter: vol. 10146," Proc. SPIE 10146, Advances in Patterning Materials and Processes XXXIV, 1014601 (Apr. 19, 2017); doi: 10.1117/12.2279325.

*Primary Examiner* — Arun S Phasge
(74) *Attorney, Agent, or Firm* — Muir Patent Law, PLLC

(57) ABSTRACT

A filter structure for chemical solution used in manufacturing an integrated circuit includes: a first membrane structure comprising a plurality of membrane units, each comprising a cathode comprising a plurality of first openings, an anode comprising a plurality of second openings, and an insulating layer between the cathode and the anode; and a filter housing configured to receive the first membrane structure therein, the filter housing comprising an inlet through which the chemical solution is introduced and an outlet through which the chemical solution is discharged. The first membrane structure is configured such that when an electric field is applied between the cathode and the anode while the chemical solution introduced through the inlet passes through the first membrane structure, impurities having both positively charged particles and negatively charged particles in the (Continued)

chemical solution are trapped in the first membrane structure.

20 Claims, 16 Drawing Sheets

(51) Int. Cl.
*B01D 63/06* (2006.01)
*B01D 61/46* (2006.01)
*G03F 7/16* (2006.01)
*H01L 21/027* (2006.01)
*B01D 29/58* (2006.01)
*B01D 29/15* (2006.01)

(52) U.S. Cl.
CPC ............... *G03F 7/16* (2013.01); *G03F 7/26* (2013.01); *B01D 29/15* (2013.01); *B01D 29/58* (2013.01); *H01L 21/0273* (2013.01)

(56) References Cited

U.S. PATENT DOCUMENTS

| | | |
|---|---|---|
| 7,132,049 B2 | 11/2006 | Hou et al. |
| 7,223,341 B2 | 5/2007 | Wu et al. |
| 9,263,708 B2 | 2/2016 | Jang |
| 9,360,758 B2 | 6/2016 | Lo et al. |
| 2015/0054173 A1* | 2/2015 | Kim ................ H01L 21/565 257/774 |
| 2016/0086787 A1 | 3/2016 | Heeren et al. |

* cited by examiner

FILTER STRUCTURE FOR CHEMICAL SOLUTION USED IN MANUFACTURING INTEGRATED CIRCUIT AND APPARATUS FOR SUPPLYING CHEMICAL SOLUTION INCLUDING FILTER STRUCTURE FOR CHEMICAL SOLUTION

CROSS-REFERENCE TO RELATED APPLICATION

This application claims the benefit under 35 U.S.C. § 119 to Korean Patent Application No. 10-2018-0009935, filed on Jan. 26, 2018, in the Korean Intellectual Property Office, the disclosure of which is incorporated herein in its entirety by reference.

BACKGROUND

Exemplary embodiments according to the inventive concepts relate to a filter structure for chemical solution used in manufacturing an integrated circuit and an apparatus for supplying the chemical solution, including the same, and more particularly, to a filter structure for chemical solution and an apparatus for supplying the chemical solution, including the same, the filter structure being used for filtering photoresist solution.

With a trend of a lightweight and slim electronic product, a requirement for high integration of an integrated circuit increases. Since a line width of features is reduced due to down-scaling of an integrated circuit, a pattern defect may occur due to impurities having a fine size and contained in photoresist solution during a patterning process of features.

SUMMARY

The inventive concept according to exemplary embodiments provides a filter structure for chemical solution and an apparatus for supplying the chemical solution, including the same, capable of filtering impurities having a fine size and contained in photoresist solution, and thus reducing a pattern defect of an integrated circuit.

According to an aspect of the inventive concept, there is provided a filter structure for chemical solution used in manufacturing an integrated circuit, the filter structure including: a first membrane structure comprising a plurality of membrane units, each comprising a cathode comprising a plurality of first openings, an anode comprising a plurality of second openings, and an insulating layer between the cathode and the anode; and a filter housing configured to receive the first membrane structure therein, the filter housing comprising an inlet through which the chemical solution is introduced and an outlet through which the chemical solution is discharged. The first membrane structure is configured such that when an electric field is applied between the cathode and the anode while the chemical solution introduced through the inlet passes through the first membrane structure, impurities having both positively charged particles and negatively charged particles in the chemical solution are trapped in the first membrane structure.

According to another aspect of the inventive concept, there is provided an apparatus for supplying chemical solution including a first filter structure, the first filter structure including: a first filter housing comprising an inlet through which the chemical solution is introduced and an outlet through which the chemical solution is discharged; and a first membrane structure received inside the first filter housing, wherein the first membrane structure comprises a plurality of membrane units, each comprising a cathode, an anode, and an insulating layer between the cathode and the anode, the insulating layer being configured to electrically separate the cathode from the anode. The first membrane structure is configured such that when an electric field is applied between the cathode and the anode while the chemical solution introduced through the inlet passes through the first membrane structure, impurities having charged particles in the chemical solution are trapped in the first membrane structure.

According to another aspect of the inventive concept, there is provided an apparatus for supplying chemical solution including a filter structure, the filter structure including: a filter housing including an inlet through which the chemical solution is introduced, and an outlet through which the chemical solution is discharged; an electric field membrane structure received inside the filter housing; and a polymer membrane received inside the filter housing and including a plurality of pores, wherein the electric field membrane structure includes a plurality of electric field membrane units, each including a cathode including a plurality of first openings, an anode including a plurality of second openings, and an insulating layer between the cathode and the anode, the insulating layer electrically separating the cathode from the anode and including a plurality of third openings.

BRIEF DESCRIPTION OF THE DRAWINGS

Embodiments of the inventive concept will be more clearly understood from the following detailed description taken in conjunction with the accompanying drawings in which.

DETAILED DESCRIPTION

Hereinafter, an exemplary embodiment of the inventive concept is described in detail with reference to the accompanying drawings.

Figure 1:
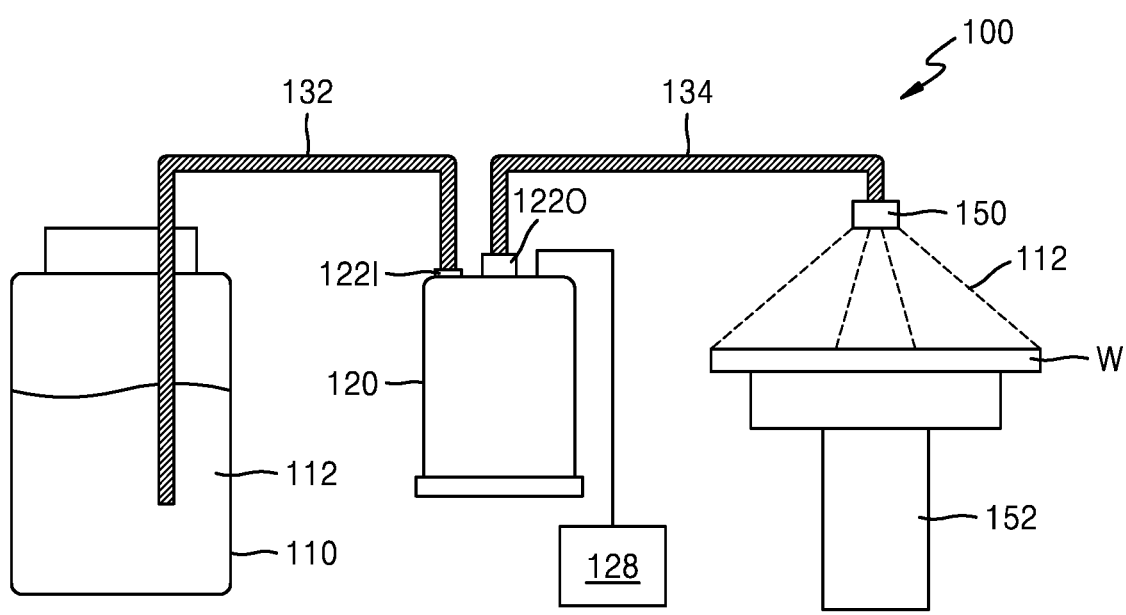
FIG. 1 is a view of an apparatus for supplying chemical solution according to an exemplary embodiment.
Figure 2:
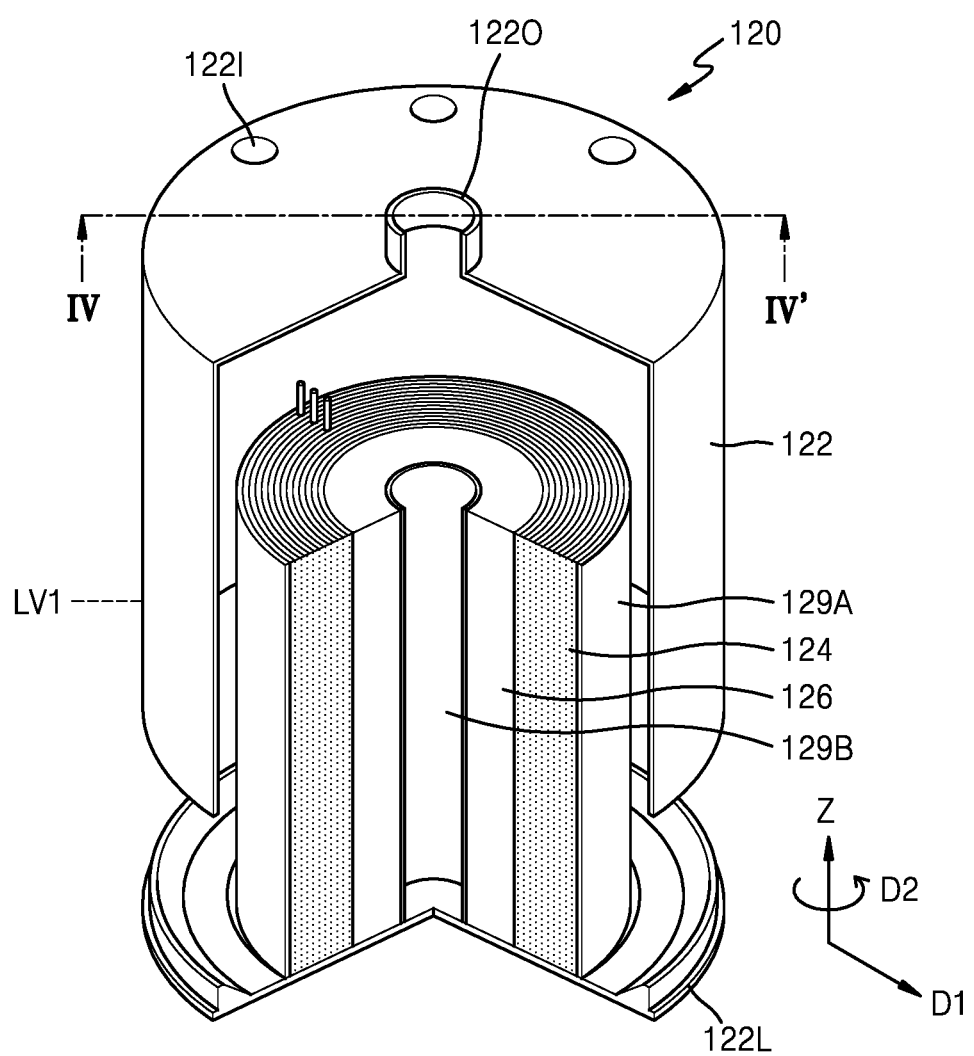
FIG. 2 is an exploded perspective view of a filter structure of FIG. 1.
Figure 3:
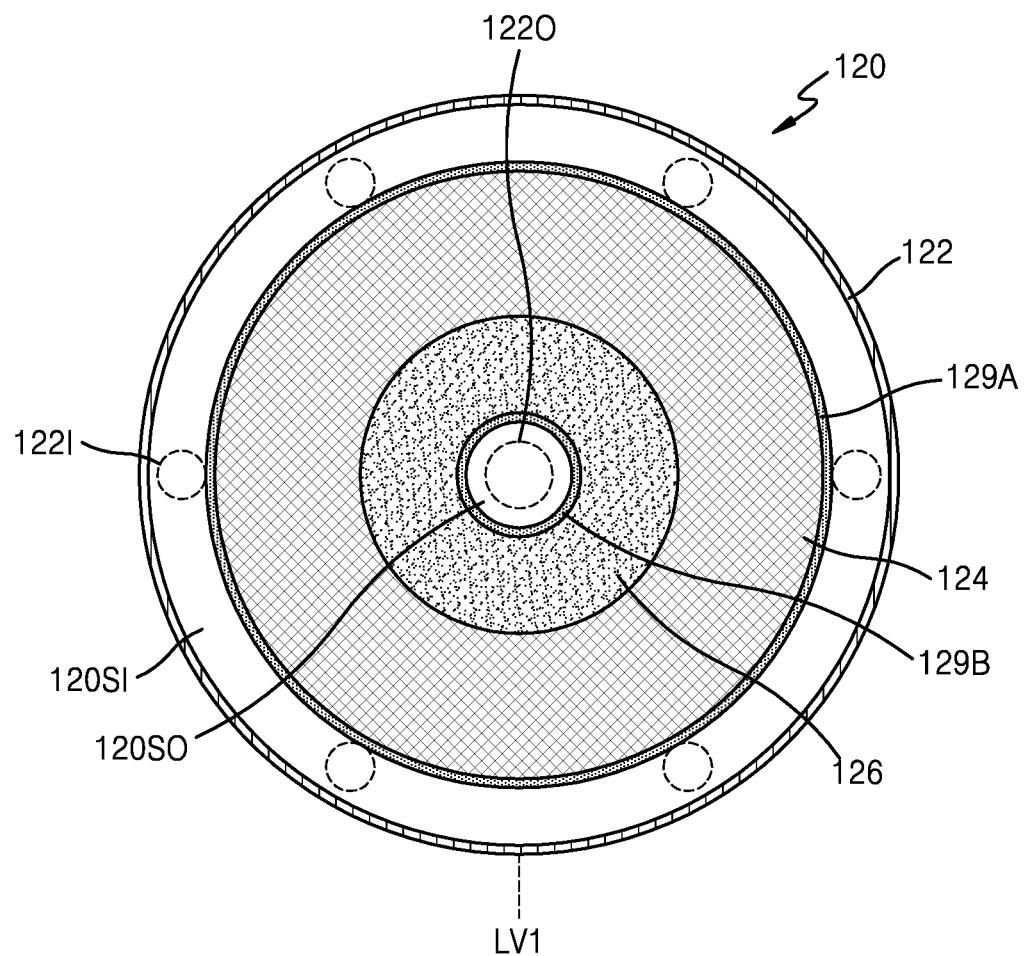
FIG. 3 is a horizontal cross-sectional view taken along first level LV1 of FIG. 2.
Figure 4:
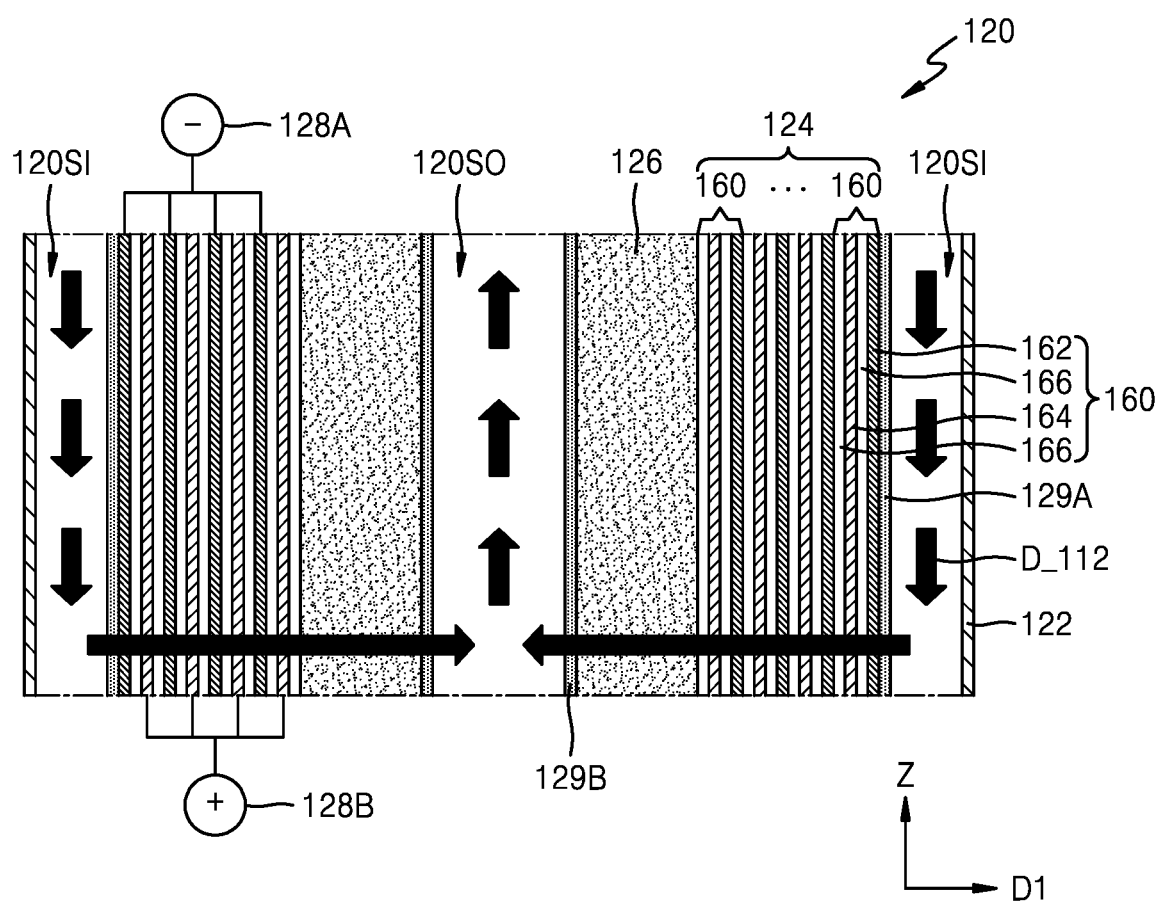
FIG. 4 is a cross-sectional view taken along line IV-IV' of FIG. 2.
Figure 5:
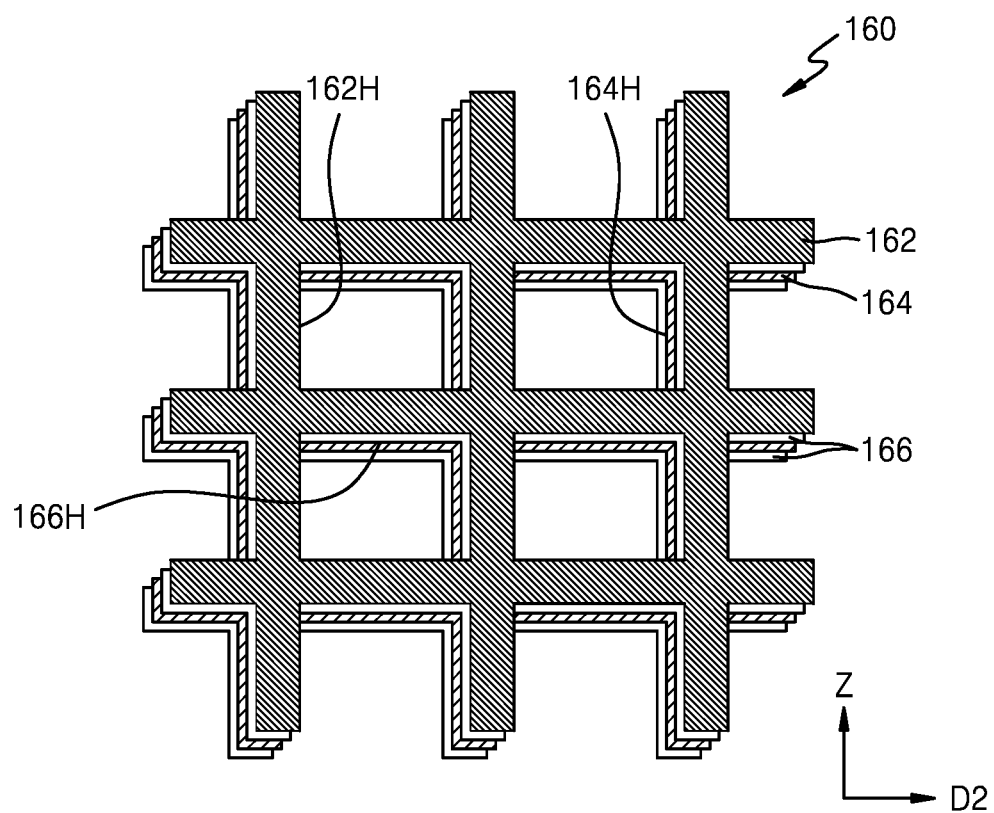
FIG. 5 is a perspective view of an unfolded state of each of a plurality of field membrane units included in a field membrane structure of FIG. 2.

FIG. 1 is a view of an apparatus 100 for supplying chemical solution according to an exemplary embodiment. FIG. 2 is an exploded perspective view of a filter structure 120 of FIG. 1, FIG. 3 is a horizontal cross-sectional view taken along a first level LV1 of FIG. 2, FIG. 4 is a cross-sectional view taken along line IV-IV' of FIG. 2, and FIG. 5 is a perspective view of an unfolded state of each of a plurality of field membrane units 160 included in a field membrane structure 124 of FIG. 2.

Referring to FIGS. 1 to 5, the apparatus 100 for supplying chemical solution may include a chemical solution storage tank 110, the filter structure 120, a chemical solution supply line 132, a chemical solution discharge line 134, and a chemical solution spray unit 150. The filter structure 120 may simply be referred to as a filter and may be configured to filter both small-sized metal impurity particles (e.g., metal impurity particles each having a size of about 0.5 nm) and large-sized metal impurity particles (e.g., metal impurity particles each having a size larger than 0.5 nm) in the chemical solution supplied via the chemical solution supply line 132 into the filer structure 120 prior to discharging the chemical solution to the chemical solution discharge line 134.

For example, the apparatus 100 for supplying chemical solution may be an apparatus configured to supply photoresist solution to a substrate W, the photoresist solution being used during a photolithography process for manufacturing an integrated circuit. The apparatus 100 for supplying chemical solution may be configured to introduce a chemical solution 112 contained in the chemical solution storage tank 110 to the filter structure 120 through the chemical solution supply line 132, filter impurities in the chemical solution 112 inside the filter structure 120, and supply the impurity-filtered chemical solution 112 onto the substrate W arranged on a substrate support 152 by using the chemical solution spray unit 150 through the chemical solution discharge line 134.

According to exemplary embodiments, the chemical solution storage tank 110 may be a storage tank configured to store chemical solution, for example, photoresist solution which may be used during a manufacturing process of an integrated circuit. In other exemplary embodiments, the chemical solution storage tank 110 may be a storage tank configured to store slurry solution for a chemical mechanical polishing (CMP) process, or precursor solution which is used as a source material during a process of forming a material layer. However, a kind of the chemical solution contained inside the chemical solution storage tank 110 is not limited thereto.

The filter structure 120 may be configured to filter impurities in the chemical solution 112 introduced into the filter structure 120 through the chemical solution supply line 132, and discharge the chemical solution 112 through the chemical solution discharge line 134, the impurities in the chemical solution 112 being removed while the chemical solution 112 passes through the filter structure 120. The filter structure 120 may particularly filter both impurities having a large particle size and charged particles having a small particle size. For example, the charged particles may include, for example, organic particles having a polarity, inorganic particles having a polarity, and metal ions.

The filter structure 120 may include a filter housing 122, a field membrane structure 124 arranged inside the filter housing 122, a polymer membrane 126, a first holding portion 129A, a second holding portion 129B, and a voltage supply 128 electrically connected to the field membrane structure 124. In the present specification, it is understood that when an element is referred to as being "electrically connected" to another element, it may be connected directly to the other element or intervening elements may be present. As used herein, and unless indicated otherwise, items described as being "electrically connected" are configured such that an electrical signal and/or power can be passed from one item to the other.

The filter housing 122 may be, for example, a cylindrical container, and may include an inlet 122I and an outlet 122O. The inlet 122I may be connected to the chemical solution supply line 132, and the outlet 122O may be connected to the chemical solution discharge line 134. The filter housing 122 may include a removable lid 122L such that the field membrane structure 124 and/or the polymer membrane 126 are replaced or washed. However, the filter housing 122 is not limited thereto and may be a one-body container not including the removable lid 122L. In FIGS. 2 to 5, for convenience of description, a length direction or an axial direction of the filter housing 122 having a cylindrical shape is denoted by a Z direction, a radial direction from a center of a bottom of the filter housing 122 to an edge of the bottom is denoted by a D1 direction, and an angular direction along a lateral wall of the filter housing 122 is denoted by a D2 direction.

The field membrane structure 124 may be arranged in a hollow cylindrical shape inside the filter housing 122, and the polymer membrane 126 may be arranged in a hollow cylindrical shape on an inner wall of the field membrane structure 124. Here, a lateral wall of the field membrane structure 124 among the lateral walls of the field membrane structure 124 which is closer to an inner wall of the filter housing 122 and closer to the first holding portion 129A is denoted by an outer wall of the field membrane structure 124, and a lateral wall of the field membrane structure 124 among the lateral walls of the field membrane structure 124 which is away from the inner wall of the filter housing 122 and closer to the second holding portion 129B is denoted by an inner wall of the field membrane structure 124. Also, a lateral wall of the polymer membrane 126 among the lateral walls of the polymer membrane 126 which is closer to the inner wall of the filter housing 122 and closer to the first holding portion 129A is denoted by an outer wall of the polymer membrane 126, and a lateral wall of the polymer membrane 126 among the lateral walls of the polymer membrane 126 which is away from the inner wall of the filter housing 122 and closer to the second holding portion 129B is denoted by an inner wall of the polymer membrane 126. According to exemplary embodiments, the inner wall of the field membrane structure 124 and the outer wall of the polymer membrane 126 may be arranged adjacent to each other and the inner wall of the field membrane structure 124 is in contact with the outer wall of the polymer membrane 126. It will be understood that when an element is referred to as "in contact with" another element, there are no intervening elements present at the point of contact. Both the field membrane structure 124 and the polymer membrane 126 may have a hollow cylindrical shape extending in the Z direction, and the field membrane structure 124 may surround the outer wall of the polymer membrane 126 and extend in the Z direction. The first holding portion 129A may be arranged on the outer wall of the field membrane structure 124, and the second holding portion 129B may be arranged on the inner wall of the polymer membrane 126.

As illustrated in FIGS. 4 and 5, the field membrane structure 124 may include a plurality of field membrane units 160, and each of the field membrane units 160 may include a cathode 162, an anode 164, and an insulating layer 166 between the cathode 162 and the anode 164 sequentially arranged. Although FIG. 4 illustrates that four field membrane units 160 are stacked and arranged in a cylindrical shape, they are not limited thereto, and the number of field membrane units 160 may be properly selected by an arbitrary number between 1 and 1000. According to exemplary embodiments, the outer wall of the polymer membrane 126 is in contact with insulating layer 166 of the field membrane unit 160 which is away from the inner wall of the filter housing 122 and closer to polymer membrane 126 (i.e., the cathode of the innermost field membrane unit 160) among the plurality of field membrane units 160 of the field membrane structure 124.

FIG. 5 is a plan view in which each of the field membrane units 160 is unfolded. As illustrated in FIG. 5, the cathode 162 may include a plurality of first openings 162H, and have a mesh configuration in which the first openings 162H are regularly arranged in the D2 direction and the Z direction. The anode 164 may include a plurality of second openings 164H, and have a mesh configuration in which the second openings 164H are regularly arranged in the D2 direction and the Z direction. The insulating layer 166 may include a plurality of third openings 166H, and have a mesh configuration in which the third openings 166H are regularly arranged in the D2 direction and the Z direction.

According to exemplary embodiments, each of the cathode 162, the anode 164, and the insulating layer 166 may have a thickness of about 5 nm to about 1 cm in the D1 direction as illustrated in FIG. 4, and each of the first to third openings 162H, 164H, and 166H may have a width of about 5 nm to about 1 cm in the D1 direction as illustrated in FIG. 4. Also, each of the cathode 162, the anode 164, and the insulating layer 166 may have a mesh configuration in which a plurality of lanes (not shown) extend in the D2 direction or the Z direction, and cross each other. Each of the lanes may have a width of about 5 nm to about 0.3 cm in the D2 direction or the Z direction. However, the dimensions of each of the cathode 162, the anode 164, and the insulating layer 166 is not limited thereto.

The insulating layer 166 may be arranged between the cathode 162 and the anode 164 to prevent contact between the cathode 162 and the anode 164. FIG. 5 illustrates that the cathode 162, the anode 164, and the insulating layer 166 respectively include the first to third openings 162H, 164H, and 166H having substantially the same size and same rectangular shape. However, the scope of the inventive concept is not limited thereto, and the third openings 166H of the insulating layer 166 may have a size less than those of the first openings 162H of the cathode 162 and the second openings 164H of the anode 164, and even in the case where the cathode 162 and/or the anode 164 are shifted with respect to each other by a preset width, contact between the cathode 162 and the anode 164 may be prevented.

According to exemplary embodiments, the cathode 162 and the anode 164 may include at least one metal such as Cu, Zn, Al, Mg, Ni, Ag, Pt, or alloys thereof, a metal oxide such as a titanium oxide, a scandium oxide, a vanadium oxide, a zinc oxide, a gallium oxide, a yttrium oxide, a zirconium oxide, a niobium oxide, a molybdenum oxide, an indium oxide, a tin oxide, a lanthanoid group oxide, a tungsten oxide, an iridium oxide, a magnesium oxide, a strontium oxide, or combinations thereof, a composite material electrode including a metal/carbon composite material, a metal/carbon fiber composite material, a metal/graphene composite material, etc., and a conductive polymer electrode. However, the materials of the cathode 162 and the anode 164 are not limited thereto.

According to exemplary embodiments, the insulating layer 166 may include an organic material such as polyethylene (PE), polytetrafluoroethylene (PTFE), polyvinylidene fluoride (PVDF), nylon, polypropylene (PP), polyester, polycarbonate, polyethersulfone, cellulose acetate, and polyimide. In other embodiments, the insulating layer 166 may include an inorganic material such as a silicon oxide, a silicon nitride, and a silicon carboxide.

A cathode-field apply member 128A (e.g., a cathode-field conductor or wire) may be connected to the cathode 162, and an anode-field apply member 128B (e.g., an anode-field conductor or wire) may be connected to the anode 164. The cathode-field apply member 128A and the anode-field apply member 128B may be electrically connected to the voltage supply 128 arranged outside the filter housing 122, and configured to apply an electric field between the cathode 162 and the anode 164 by using a voltage provided from the voltage supply 128. For example, a voltage may be applied from the voltage supply 128 such that an electric field ranging from about 0 to about 10 kV/m is applied between the cathode 162 and the anode 164, but the range of the electric field is not limited thereto. A voltage applied from the voltage supply 128 may change depending on a kind and a size of charged particles in the chemical solution 112. The chemical solution 112 may pass through the first openings 162H of the cathode 162, the second openings 164H of the anode 164, and the third openings 166H of the insulating layer 166, and impurities including the charged particles inside the chemical solution 112 may be trapped in the cathode 162 and the anode 164 by the electric field applied to the cathode 162 and the anode 164. Particularly, positively charged particles in the chemical solution 112 and taking a positive charge thereon may be attached onto the cathode 162, and negatively charged particles in the chemical solution 112 and taking a negative charge thereon may be attached onto the anode 164. Therefore, the field membrane structure 124 may simultaneously filter positively charged particles and negatively charged particles. According to exemplary embodiments, since impurities including the charged particles inside the chemical solution 112 may be trapped in the cathode 162 and the anode 164 by the electric field applied to the cathode 162 and the anode 164, the field membrane structure 124 may also be referred to as an electric-field membrane.

The polymer membrane 126 may be arranged inside the field membrane structure 124. The polymer membrane 126 may be a polymer filter which may filter impurities in the chemical solution 112. The polymer membrane 126 may include a plurality of pores (not shown), and filter particles having a size greater than a diameter of the pores. For example, the pores of the polymer membrane 126 may have a diameter greater than a size of a photoresist particle in photoresist solution. Therefore, the photoresist particle in the photoresist solution is not filtered by the polymer membrane 126, and large-sized impurities each having a size greater than the diameter of the pores may be filtered by the polymer membrane 126.

According to exemplary embodiments, the polymer membrane 126 may include an organic material such as polyethylene (PE), polytetrafluoroethylene PTFE, polyvinylidene fluoride (PVDF), nylon, polypropylene (PP), polyester, polycarbonate, polyethersulfone, cellulose acetate, or polyimide.

As illustrated in FIG. 4, the field membrane structure 124 may be spaced apart from an inner wall of the filter housing 122, and an inlet portion 120SI may be defined between the inner wall of the filter housing 122 and the outer wall of the field membrane structure 124. Also, an outlet portion 120SO extending in the Z direction may be defined between a center of the filter structure 120 and the inner wall of the polymer membrane 126. The inlet portion 120SI may indicate an empty space defined between the inner wall of the filter housing 122 and the outer wall of the field membrane structure 124, and the outlet portion 120SO may indicate an empty space defined by the inner wall of the polymer membrane 126 having a cylindrical shape. The inlet portion 120SI may communicate with the inlet 122I of the filter housing 122, and the outlet portion 120SO may communicate with the outlet 122O of the filter housing 122.

The first holding portion 129A may be arranged such that the first holding portion 129A is exposed by the inlet portion 120SI on the outer wall of the field membrane structure 124, and the second holding portion 129B may be arranged such that the second holding portion 129B is exposed by the outlet portion 120SO on the inner wall of the polymer membrane 126. The first holding portion 129A and the second holding portion 129B structurally hold the field membrane structure 124 and the polymer membrane 126, and may include the plurality of pores such that the chemical solution 112 easily passes through the first holding portion 129A and the second holding portion 129B. The first holding portion 129A and the second holding portion 129B may include a polymer material such as PE and PP.

According to exemplary embodiments, a carbon cover layer (not shown) may be further arranged on the first holding portion 129A and/or between the first holding portion 129A and the field membrane structure 124. The carbon cover layer may include a plurality of pores, and photoresist particles may pass through the pores. The carbon cover layer may include a carbon nanosheet, a carbon cloth, etc. The carbon cover layer may serve as a protective layer configured to prevent photoresist particles from being adsorbed by the field membrane structure 124.

A flow of the chemical solution 112 inside the filter structure 120 is illustrated by an arrow D_112 of FIG. 4. When the chemical solution 112 is introduced into the filter structure 120 through the inlet 122I, the chemical solution 112 may fill the inside of the inlet portion 120SI first, sequentially pass through the field membrane structure 124 and the polymer membrane 126, pass through the outlet portion 120SO, and may be discharged to the outside of the filter structure 120. While the chemical solution 112 passes through the field membrane structure 124, charged particles in the chemical solution 112 may be trapped in the field membrane structure 124 by the electric field applied between the cathode 162 and the anode 164. After that, while the chemical solution 112 passes through the polymer membrane 126, large-sized impurities in the chemical solution 112 may be trapped in the polymer membrane 126. In contrast, primary components of the chemical solution 112, for example, photoresist particles in the photoresist solution, may pass through the field membrane structure 124 and the polymer membrane 126, may be discharged to the outside of the filter structure 120, and may be sprayed or coated onto a substrate W through the chemical solution spray unit 150 such as a spray nozzle, as illustrated in FIG. 1.

Generally, in the case where impurities are contained in photoresist solution, the impurities may flocculate during a coating process of the photoresist solution and a subsequent development process, and thus cause a bridge defect, etc. on a line pattern. To prevent this pattern defect, the photoresist solution is filtered by using a polymer membrane as a filter, the polymer membrane having a pore size which passes photoresist particles and does not pass impurity particles.

However, as down-scaling of an integrated circuit is in progress, a feature size to be patterned is also reduced, and a size of a photoresist particle corresponding to the reduced feature size is also reduced. Accordingly, a danger in which charged particles having a fine size may cause a pattern defect may be raised further. Therefore, it is desired to completely remove impurity particles, particularly, charged particles having a fine size from photoresist particles in the chemical solution 112. However, since a size of photoresist particles may not be much different from a size of charged particles (e.g. the photoresist particles may have a diameter of about 1 nm to about 5 nm, and the charged particles may have a diameter of about 0.2 nm to about 2 nm, so a difference in size between the photoresist particle and the charged particle may not be large), in the case where a polymer membrane having a small pore size is used, not only the charged particles but also the photoresist particles may be filtered simultaneously. In contrast, in the case where a polymer membrane having a large pore size is used, the charged particles having a small size may not be filtered and may cause a defect during a patterning process.

In contrast, the filter structure 120 according to the above embodiments includes the field membrane structure 124 and the polymer membrane 126, charged particles having a relatively small size may be trapped by the electric field applied between the cathode 162 and the anode 164 of the field membrane structure 124, and impurities having a relatively large size may be filtered by the polymer membrane 126. Therefore, the filter structure 120 may effectively filter the impurities in the photoresist solution, and thus prevent a pattern defect during a patterning process which uses the photoresist solution.

Although the apparatus 100 for supplying chemical solution, including the filter structure 120, is used for filtering and supplying the photoresist solution used for a patterning process of an integrated circuit in the above description, the scope of the inventive concept is not limited thereto. The apparatus 100 for supplying chemical solution, including the filter structure 120, may be used for filtering and supplying slurry solution for a CMP process, or may be used for filtering and supplying precursor solution or a precursor gas of a source material for forming a material layer included in an integrated circuit or a material layer used for a manufacturing process of an integrated circuit.

Figure 6A:
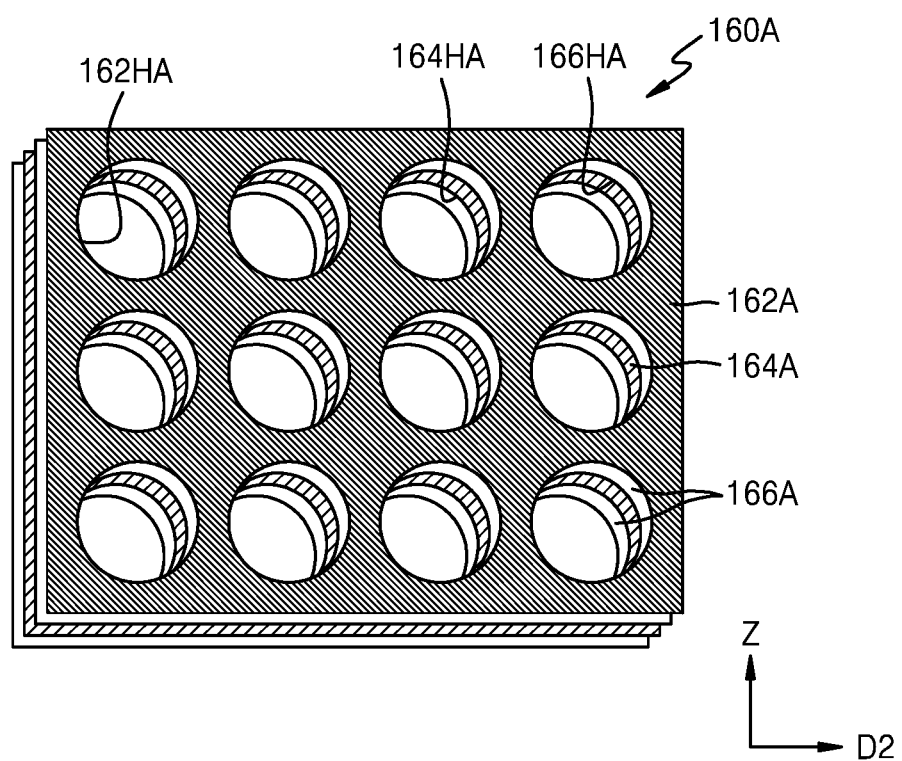
FIGS. 6A and 6B are perspective views of each of a plurality of field membrane units according to an exemplary embodiment.
Figure 6B:
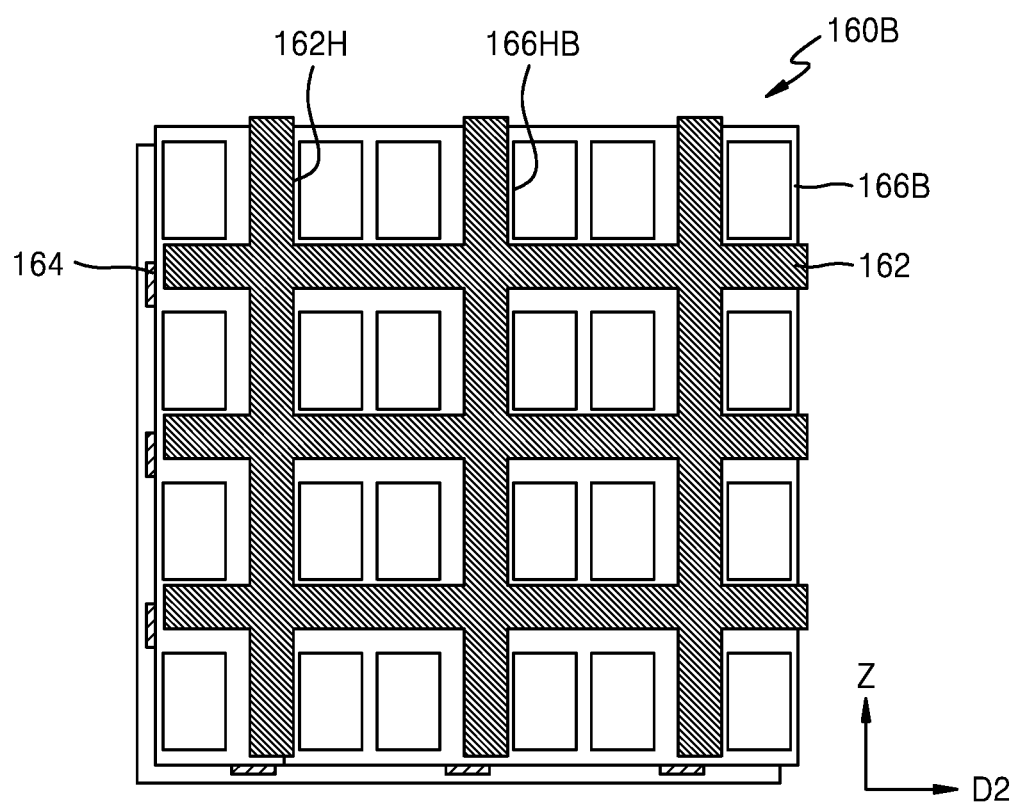

FIGS. 6A and 6B are perspective views of each of a plurality of field membrane units 160A and 160B according to an exemplary embodiment. In FIGS. 6A and 6B, the same reference numerals as those of FIGS. 1 to 5 denote the same elements.

Referring to FIG. 6A, a plurality of first openings 162HA of a cathode 162A, a plurality of second openings 164HA of an anode 164A, a plurality of third openings 166HA of an insulating layer 166A are regularly arranged in the D2 direction and the Z direction, and each of the first openings 162HA, the second openings 164HA, and the third openings 166HA may have a circular or elliptical shape.

According to exemplary embodiments, the plurality of first to third openings 162HA, 164HA, and 166HA may be arranged to vertically overlap one another. In other exemplary embodiments, the plurality of first to third openings 162HA, 164HA, and 166HA may be arranged to partially overlap one another. For example, the insulating layer 166A may be shifted in the D2 direction or the Z direction by a preset width with respect to the cathode 162A, and the anode 164A may be shifted in the D2 direction or the Z direction by a preset width with respect to the insulating layer 166A and/or the cathode 162A.

Also, although FIG. 6A illustrates that widths in the D2 direction or the Z direction of the plurality of first to third openings 162HA, 164HA, and 166HA are the same, according to alternative exemplary embodiments, the widths in the D2 direction or the Z direction of the plurality of first to third openings 162HA, 164HA, and 166HA may be different from one another. For example, the widths in the D2 direction or the Z direction of the plurality of first openings 162HA of the cathode 162A, and the widths in the D2 direction or the Z direction of the plurality of second openings 164HA of the anode 164A may be greater than the widths in the D2 direction or the Z direction of the plurality of third openings 166HA of the insulating layer 166A. In this exemplary embodiment, contact between the cathode 162A and the anode 164A may be prevented by the insulating layer 166A. In contrast, the widths in the D2 direction or the Z direction of the plurality of first openings 162HA of the cathode 162A, and the widths in the D2 direction or the Z direction of the plurality of second openings 164HA of the anode 164A may be less than the widths in the D2 direction or the Z direction of the plurality of third openings 166HA of the insulating layer 166A.

Referring to FIG. 6B, one first opening 162H of the cathode 162 may vertically overlap two third openings 166HB of an insulating layer 166B. Also, the widths in the D2 direction or the Z direction of the plurality of third openings 166HB of the insulating layer 166B may be less than the widths in the D2 direction or the Z direction of the plurality of first openings 162H of the cathode 162 and the widths in the D2 direction or the Z direction of the plurality of second openings 164H of the anode 164 (see FIG. 5).

Figure 7:
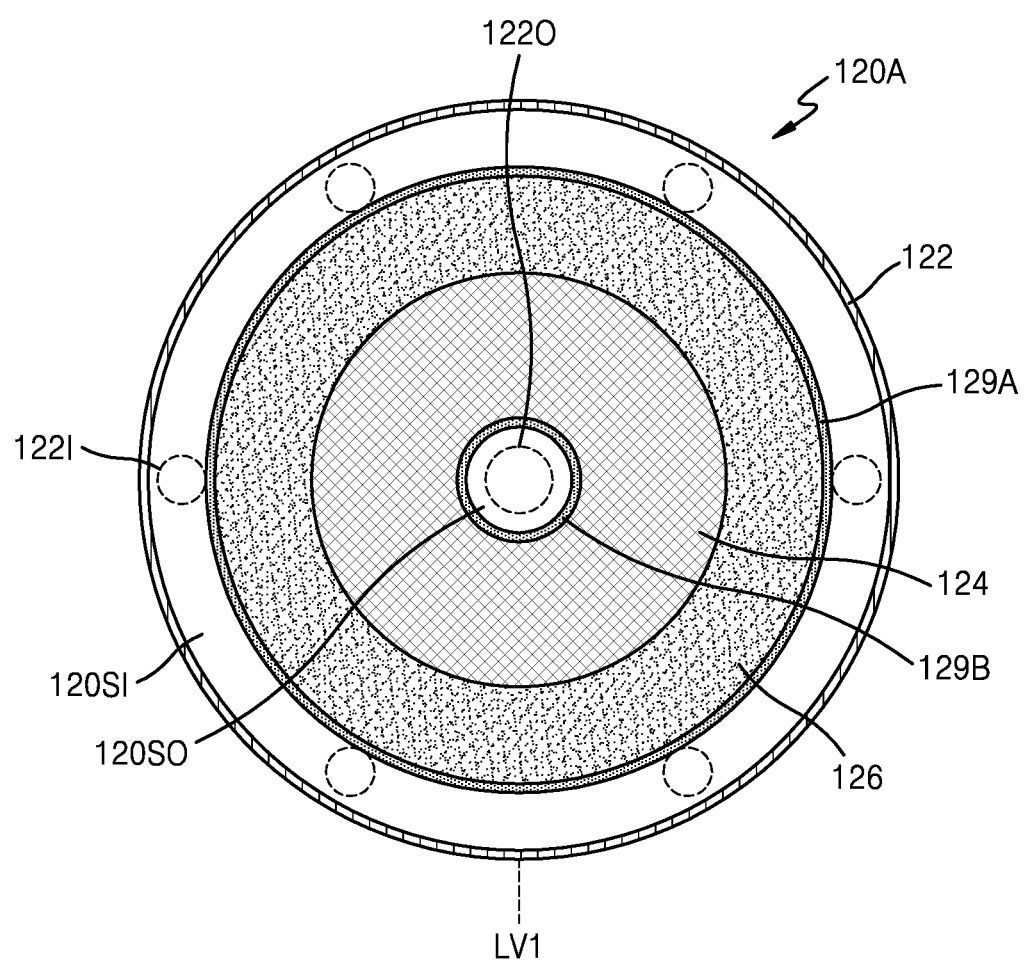
FIG. 7 is a horizontal cross-sectional view of a filter structure according to an exemplary embodiment.
Figure 8:
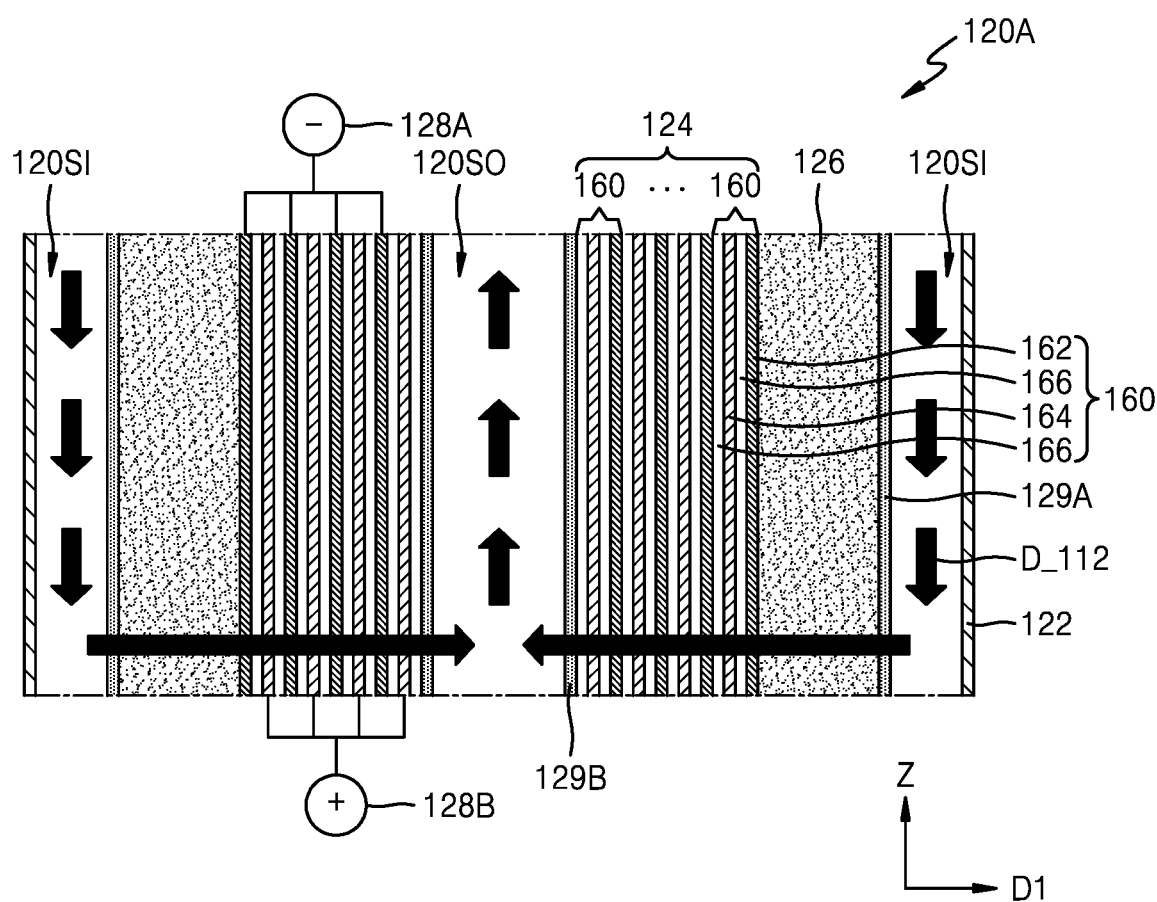
FIG. 8 is a vertical cross-sectional view of a filter structure according to an exemplary embodiment.

FIG. 7 is a horizontal cross-sectional view of a filter structure 120A according to an exemplary embodiment, and FIG. 8 is a vertical cross-sectional view of the filter structure 120A according to an exemplary embodiment. FIG. 7 is a horizontal cross-sectional view corresponding to a horizontal cross-section taken along the first level LV1 of FIG. 2, and FIG. 8 is a cross-sectional view corresponding to a cross-section taken along line IV-IV' of FIG. 2. In FIGS. 7 and 8, the same reference numerals as those of FIGS. 1 to 6B denote the same elements.

Referring to FIGS. 7 and 8, the polymer membrane 126 having a hollow cylindrical shape is arranged inside the filter housing 122, and the field membrane structure 124 may be arranged on the inner wall of the polymer membrane 126. The inlet portion 120SI may be defined between the outer wall of the polymer membrane 126 and the inner wall of the filter housing 122, and the outlet portion 120SO may be defined by a space surrounded by the inner wall of the field membrane structure 124 having the hollow cylindrical shape. Therefore, when the chemical solution 112 (see FIG. 1) is introduced into the filter structure 120A through the inlet 122I, the chemical solution 112 may fill the inside of the inlet portion 120SI, sequentially pass through the polymer membrane 126 and the field membrane structure 124, pass through the outlet portion 120SO, and may be discharged to the outside of the filter structure 120A.

The first holding portion 129A may be arranged such that the first holding portion 129A is exposed by the inlet portion 120SI on the outer wall of the polymer membrane 126, and the second holding portion 129B may be arranged such that the second holding portion 129B is exposed by the outlet portion 120SO on the inner wall of the field membrane structure 124. A carbon cover layer (not shown) may be further arranged on the second holding portion 129B and/or between the second holding portion 129B and the field membrane structure 124. The carbon cover layer may include a plurality of pores, and photoresist particles may pass through the pores. The carbon cover layer may serve as a protective layer configured to prevent the photoresist particles from being adsorbed by the field membrane structure 124. According to this exemplary embodiment, the inner wall of the polymer membrane 126 and outer wall of field membrane structure 124 may be arranged adjacent to each other and the outer wall of the field membrane structure 124 is in contact with the inner wall of the polymer membrane 126. For example, according to this exemplary embodiment, the inner wall of the polymer membrane 126 is in contact with the cathode 162 of the field membrane unit 160 which is closer to the inner wall of the filter housing 122 and closer to polymer membrane 126 (i.e., the cathode of the outermost field membrane unit 160) among the plurality of field membrane units 160 of the field membrane structure 124.

According to the above embodiments, while the chemical solution 112 passes through the polymer membrane 126, large-sized impurity particles may be filtered, and while the chemical solution 112 from which the large-sized impurity particles have been filtered passes through the field membrane structure 124, small-sized charged particles may be filtered by an electric field applied between the cathode 162 and the anode 164. Therefore, the photoresist particles in the chemical solution 112 are not filtered, while the impurity particles may be effectively filtered.

Figure 9:
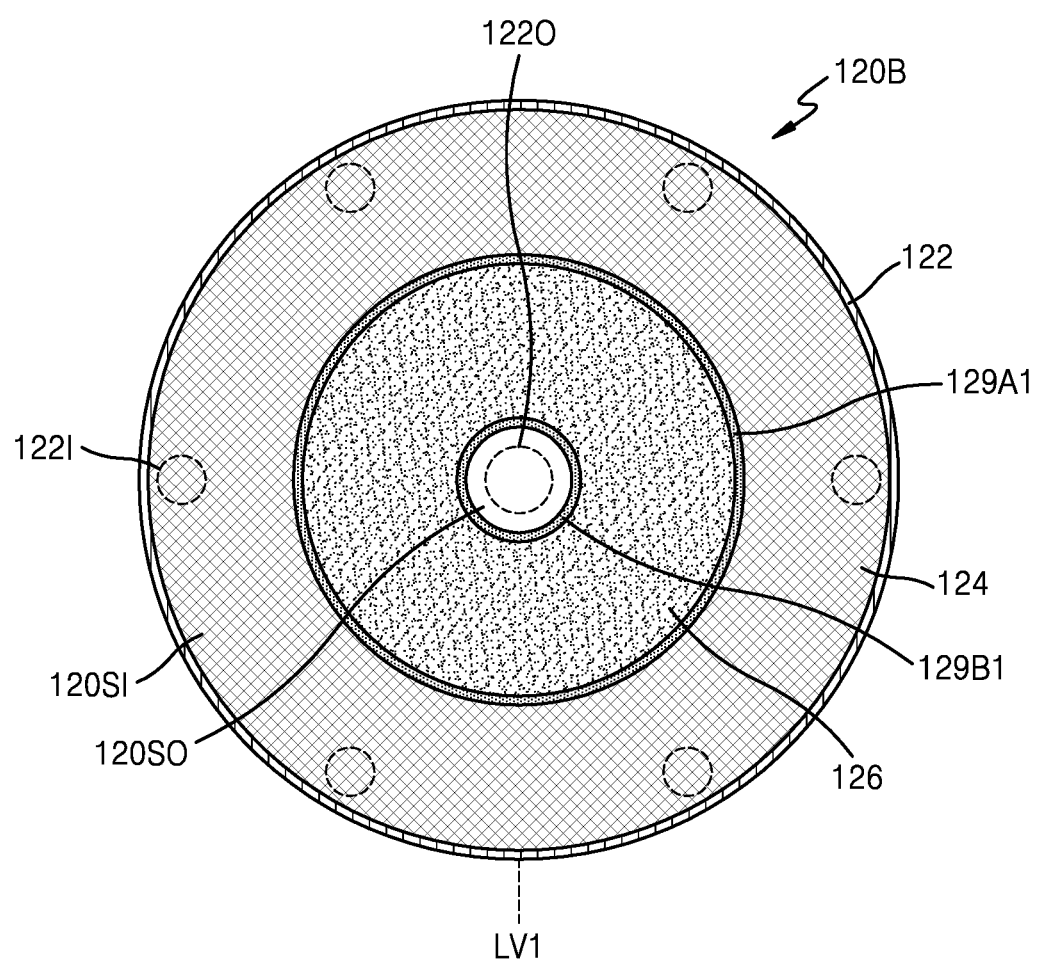
FIG. 9 is a horizontal cross-sectional view of a filter structure according to an exemplary embodiment.
Figure 10:
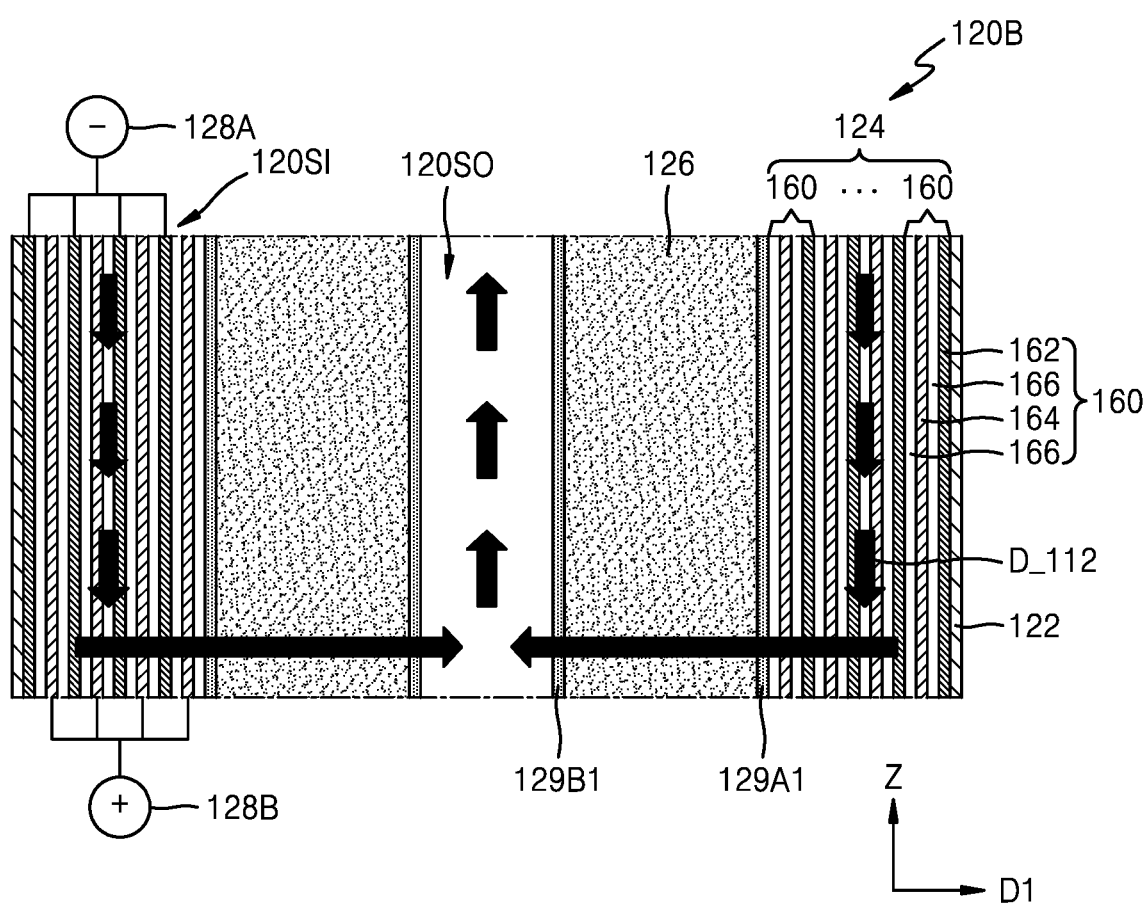
FIG. 10 is a vertical cross-sectional view of a filter structure according to an exemplary embodiment.

FIG. 9 is a horizontal cross-sectional view of a filter structure 120B according to an exemplary embodiment, and FIG. 10 is a vertical cross-sectional view of the filter structure 120B according to an exemplary embodiment. FIG. 9 is a horizontal cross-section corresponding to a horizontal cross-section taken along the first level LV1 of FIG. 2, and FIG. 10 is a cross-sectional view corresponding to a cross-section taken along line IV-IV' of FIG. 2. In FIGS. 9 and 10, the same reference numerals as those of FIGS. 1 to 8 denote the same elements.

Referring to FIGS. 9 and 10, the field membrane structure 124 having a hollow cylindrical shape may be arranged inside the filter housing 122, and the polymer membrane 126 may be arranged on the inner wall of the filed membrane structure 124. The field membrane structure 124 may be arranged to be adjacent to the inner wall of the filter housing 122, for example, arranged to contact the inner wall of the filter housing 122. Therefore, the field membrane structure 124 may fill an inner space of the inlet portion 120SI communicating with the inlet 122I of the filter housing 122. Meanwhile, the outlet portion 120SO communicating with the outlet of the filter housing 122 may indicate an empty space surrounded by the inner wall of the polymer membrane 126.

A first holding portion 129A1 may be arranged between the field membrane structure 124 and the polymer membrane 126, and a second holding portion 129B1 may be arranged on the inner wall of the polymer membrane 126.

When the chemical solution 112 (see FIG. 1) is introduced into the filter structure 120B through the inlet 122I, the chemical solution 112 may be introduced in the Z direction through the field membrane structure 124. The field membrane structure 124 includes the plurality of stacked field membrane units 160, and each of the field membrane units 160 includes the cathode 162 including the plurality of first openings 162H (see FIG. 5), the anode 164 including the plurality of second openings 164H (see FIG. 5), and the insulating layer 166 arranged between the cathode 162 and the anode 164 and including the plurality of third openings 166H (see FIG. 5). Therefore, the chemical solution 112 may move in the Z direction through the first to third openings 162H, 164H, and 166H inside the field membrane structures 124, and charged particles in the chemical solution 112 may be trapped in the cathode 162 and the anode 164 by an electric field applied between the cathode 162 and the anode 164. Since the chemical solution 112 passes through the field membrane structure 124 in a lengthwise direction (e.g., the Z direction) of the filter housing 122, a time period during which the chemical solution 112 passes through the field membrane structure 124 may be increased, thereby effectively filtering the impurity particles included inside the chemical solution 112.

The chemical solution 112, which has passed through the field membrane structure 124, may pass through the polymer membrane 126 afterward, and pass through the outlet portion 120SO, and may be discharged to the outside of the filter structure 120B.

According to the above exemplary embodiments, while the chemical solution 112 passes through the field membrane structure 124, small-sized charged particles may be filtered by the electric field applied between the cathode 162 and the anode 164, and while the chemical solution 112, from which the small-sized charged particles have been filtered, passes through the polymer membrane 126, large-sized impurity particles may be filtered. Therefore, the photoresist particles in the chemical solution 112 are not filtered, while the impurity particles may be effectively filtered.

Figure 11:
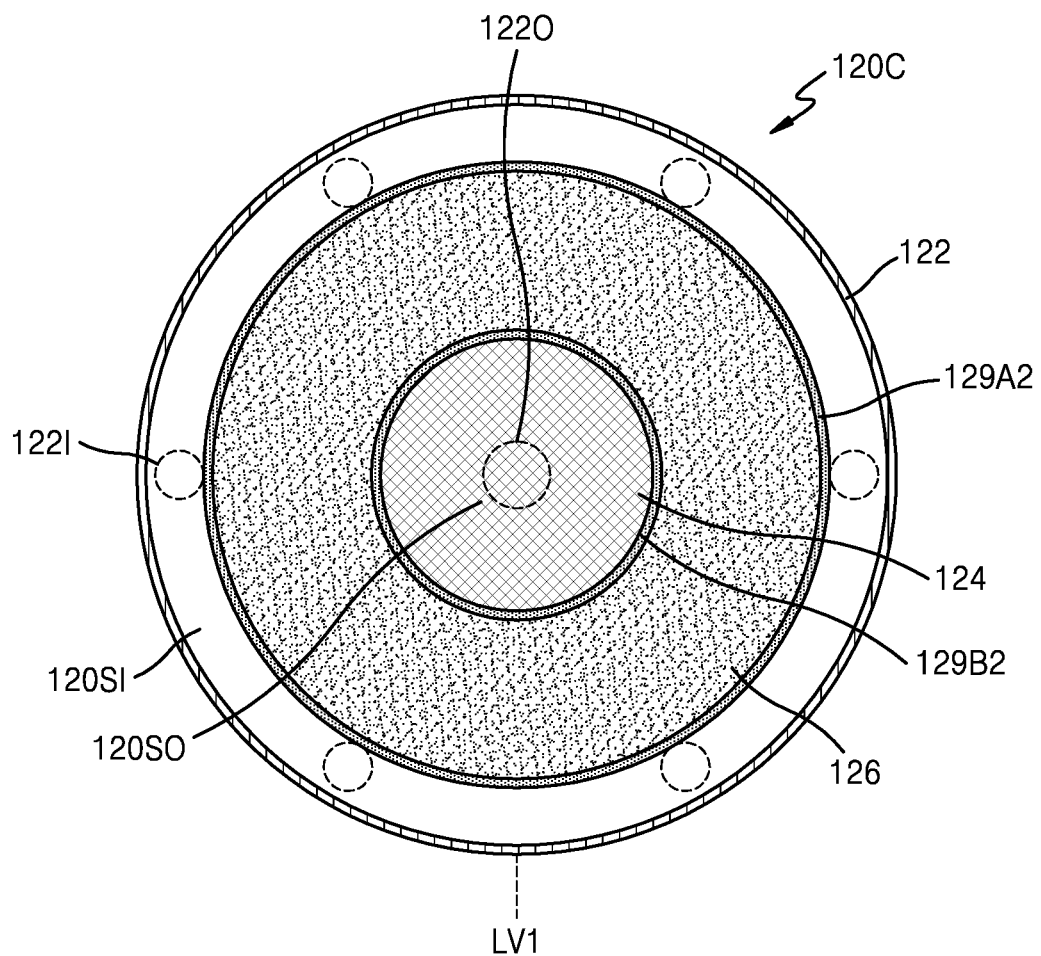
FIG. 11 is a horizontal cross-sectional view of a filter structure according to an exemplary embodiment.
Figure 12:
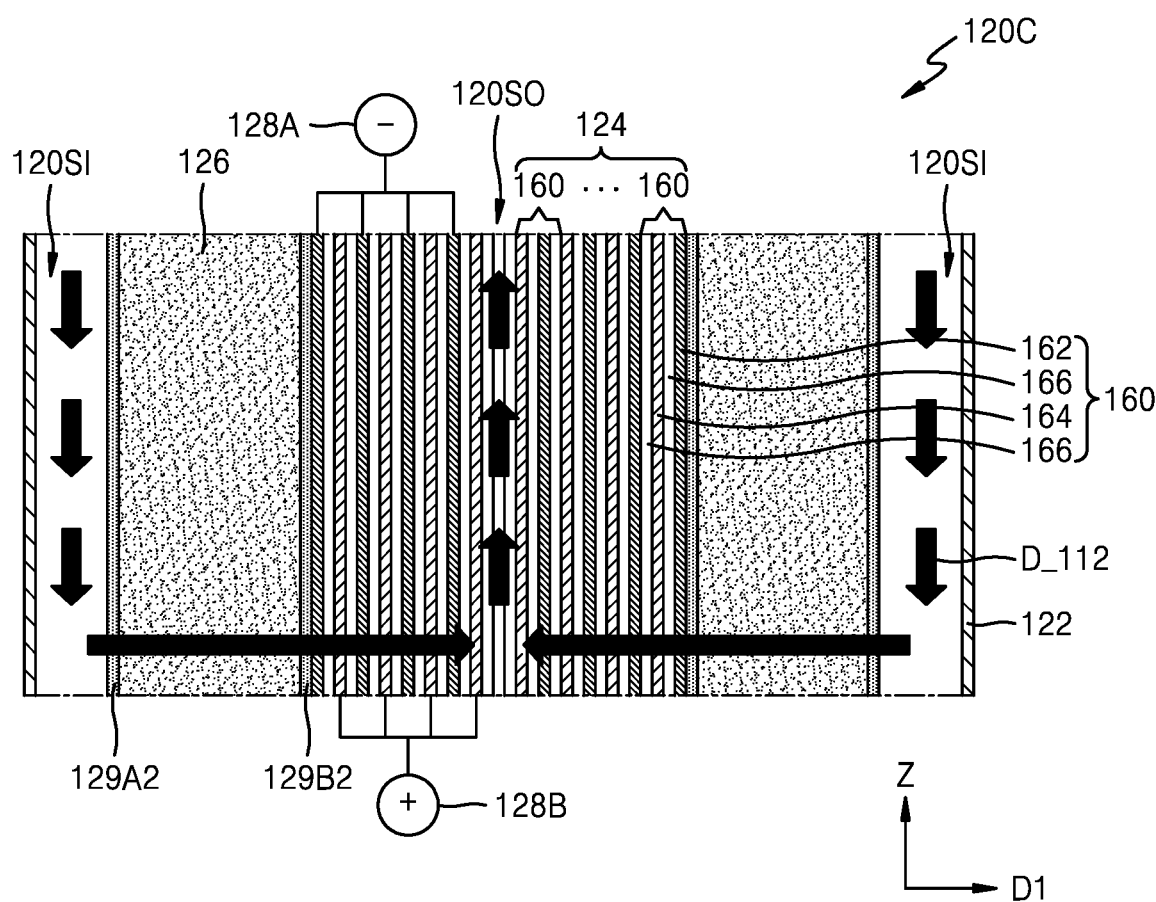
FIG. 12 is a vertical cross-sectional view of a filter structure according to an exemplary embodiment.

FIG. 11 is a horizontal cross-sectional view of a filter structure 120C according to an exemplary embodiment, and FIG. 12 is a vertical cross-sectional view of the filter structure 120C according to an exemplary embodiment. FIG. 11 is a horizontal cross-sectional view corresponding to a horizontal cross-section taken along the first level LV1 of FIG. 2, and FIG. 12 is a cross-sectional view corresponding to a cross-section taken along line IV-IV' of FIG. 2. In FIGS. 11 and 12, the same reference numerals as those of FIGS. 1 to 10 denote the same elements.

Referring to FIGS. 11 and 12, the polymer membrane 126 having a hollow cylindrical shape may be arranged inside the filter housing 122, and the field membrane structure 124 may be arranged on the inner wall of the polymer membrane 126. An empty space between the outer wall of the polymer membrane 126 and the inner wall of the filter housing 122 may be denoted by the inlet portion 120SI. The field membrane structure 124 may fill substantially an entire space surrounded by the inner space of the polymer membrane 126 having the hollow cylindrical shape. For example, the field membrane structure 124 may have a cylindrical shape. Therefore, the field membrane structure 124 may fill the inner space of the outlet portion 120SO communicating with the outlet 122O of the filter housing 122.

A first holding portion 129A2 may be arranged on the outer wall of the polymer membrane 126, and a second holding portion 129B2 may be arranged between the field membrane structure 124 and the polymer membrane 126.

When the chemical solution 112 (see FIG. 1) is introduced into the filter structure 120C through the inlet 122I, the chemical solution 112 may fill the inside of the inlet portion 120SI first, pass through the polymer membrane 126, move in the Z direction through the field membrane structure 124, and may be discharged to the outside of the filter housing 122. While the chemical solution 112 moves in the Z direction through the first to third openings 162H, 164H, and 166H (see FIG. 5) inside the field membrane structure 124, charged particles in the chemical solution 112 may be trapped in the cathode 162 and the anode 164 by an electric field applied between the cathode 162 and the anode 164. Since the chemical solution 112 passes through the field membrane structure 124 in a lengthwise direction (e.g. the Z direction) of the filter housing 122, a time period during which the chemical solution 112 passes through the field membrane structure 124 may be increased, thereby effectively filtering the impurity particles included inside the chemical solution 112.

Figure 13:
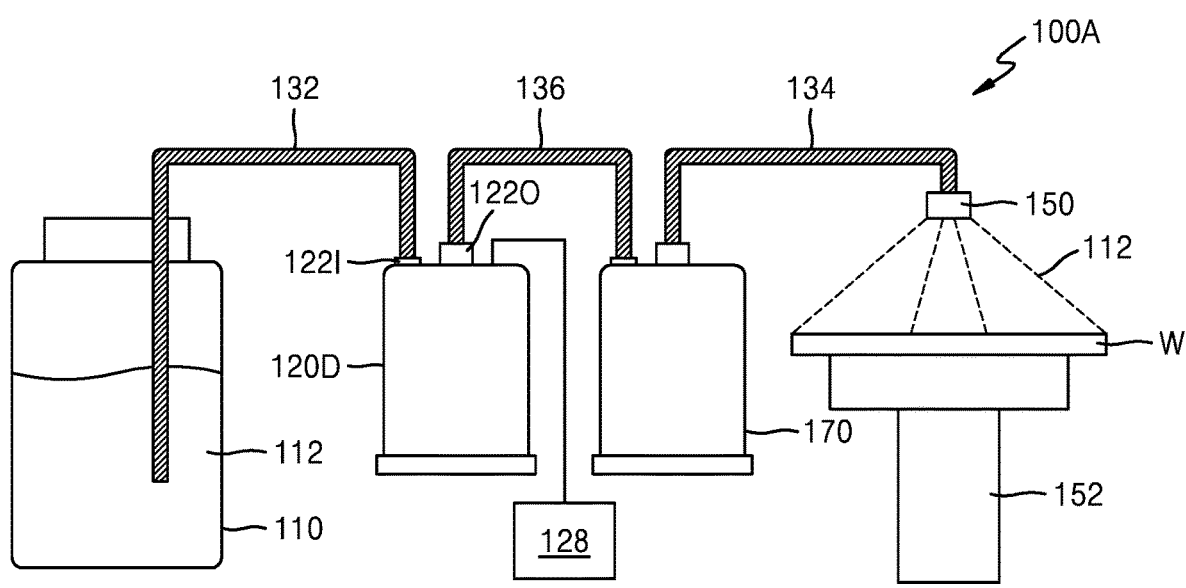
FIG. 13 is a view of an apparatus for supplying chemical solution according to an exemplary embodiment.
Figure 14:
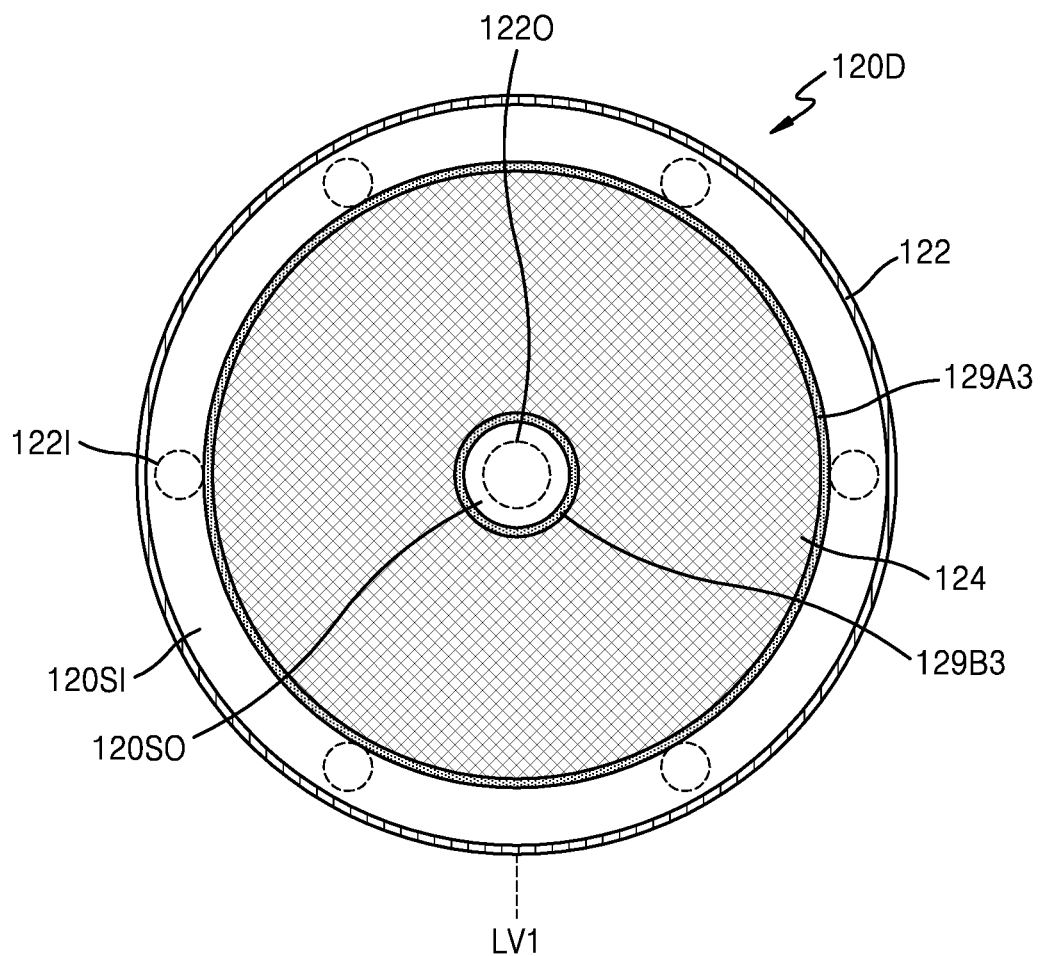
FIG. 14 is a cross-sectional view of a first filter structure of FIG. 13.
Figure 15:
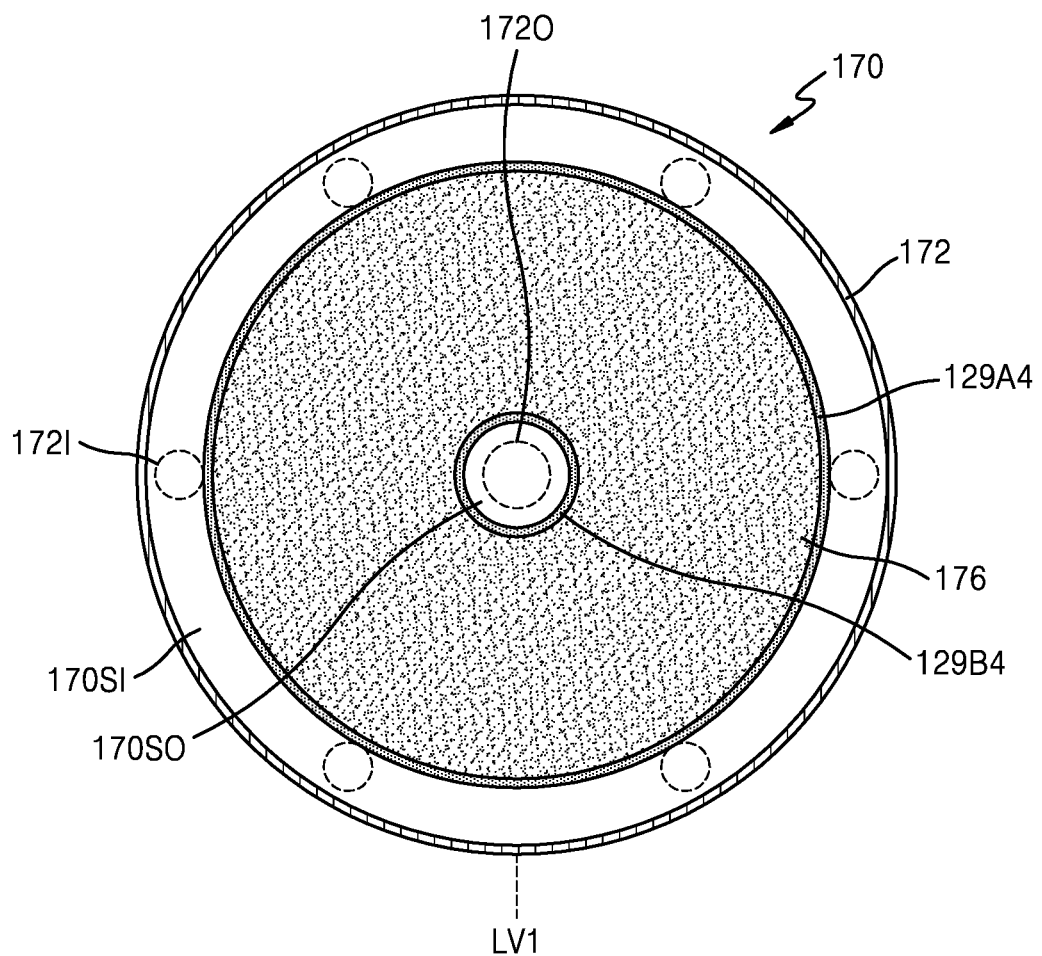
FIG. 15 is a cross-sectional view of a second filter structure of FIG. 13.

FIG. 13 is a view of an apparatus 100A for supplying chemical solution according to an exemplary embodiment, FIG. 14 is a cross-sectional view of a first filter structure 120D of FIG. 13, and FIG. 15 is a cross-sectional view of a second filter structure 170 of FIG. 13. FIGS. 14 and 15 are horizontal cross-sectional views corresponding to the horizontal cross-sectional view taken along the first level LV1 of FIG. 2. In FIGS. 13 to 15, the same reference numerals as those of FIGS. 1 to 12 denote the same elements.

Referring to FIGS. 13 to 15, the apparatus 100A for supplying chemical solution may include the first filter structure 120D to which the chemical solution 112 may be introduced from the chemical solution storage tank 110 through the chemical solution supply line 132, the second filter structure 170 to which the chemical solution 112, which has passed through the first filter structure 120D, may be introduced from the first filter structure 120D through a filter connection line 136, and the chemical solution spray unit 150 to which the chemical solution 112 may be supplied from the second filter structure 170 through the chemical solution discharge line 134. The first filter structure 120D and the second filter structure 170 may be connected in series such that the chemical solution 112 sequentially passes through the first filter structure 120D and the second filter structure 170.

The first filter structure 120D may include the field membrane structure 124 arranged inside the filter housing 122. The field membrane structure 124 may have a hollow cylindrical shape, the outer wall of the field membrane structure 124 may be spaced apart from the inner wall of the filter housing 122, and the inlet portion 120SI may be defined between the inner wall of the filter housing 122 and the outer wall of the field membrane structure 124. Also, the outlet portion 120SO extending in the Z direction may be defined between the center of the first filter structure 120D and the inner wall of the field membrane structure 124. A first holding portion 129A3 may be arranged on the outer wall of the field membrane structure 124, and a second holding portion 129B3 may be arranged on the inner wall of the field membrane structure 124.

The second filter structure 170 may include a polymer membrane 176 arranged inside a filter housing 172. The polymer membrane 176 may have a hollow cylindrical shape, the outer wall of the polymer membrane 176 may be spaced apart from the inner wall of the filter housing 172, an inlet portion 170SI may be defined between the inner wall of the filter housing 172 and the outer wall of the polymer membrane 176, and the inlet portion 170SI may communicate with an inlet 172I. Also, an outlet portion 170SO extending in the Z direction may be defined between a center of the second filter structure 170 and the inner wall of the polymer membrane 176, and the outlet portion 170SO may communicate with an outlet 172O. A third holding portion 129A4 may be arranged on the outer wall of the polymer membrane 176, and a fourth holding portion 129B4 may be arranged on the inner wall of the polymer membrane 176.

According to the above embodiments, since the first filter structure 120D may be connected to the second filter structure 170 by the filter connection line 136, the chemical solution 112 may sequentially pass through the first filter structure 120D and the second filter structure 170. While the chemical solution 112 passes through the first filter structure 120D, small-sized charged particles may be filtered by an electric field applied between the cathode 162 and the anode 164 of the field membrane structure 124 arranged inside the first filter structure 120D. While the chemical solution 112, which has been discharged to the outside of the first filter structure 120D, passes through the second filter structure 170, large-sized impurity particles may be filtered by the polymer membrane 176 arranged inside the second filter structure 170. Therefore, photoresist particles in the chemical solution 112 are not filtered, while the impurity particles may be effectively filtered.

In the above embodiment, description has been made to a configuration in which the first filter structure 120D is connected to the second filter structure 170 such that the chemical solution 112 passes through the first filter structure 120D including the field membrane structure 124 first, and then passes through the second filter structure 170 including the polymer membrane 176. However, in other exemplary embodiments, the first filter structure 120D may be connected to the second filter structure 170 such that the chemical solution 112 passes through the second filter structure 170 including the polymer membrane 176 first, and then passes through the first filter structure 120D including the field membrane structure 124.

In the above exemplary embodiment, the apparatus 100A for supplying chemical solution has been described to include one filter structure 120D including the field membrane structure 124. However, in other exemplary embodiments, the apparatus 100A for supplying chemical solution may include two first filter structures 120D, a first voltage may be applied to one of the two first filter structures 120D, and a second voltage different from the first voltage may be applied to the other of the two first filter structures 120D.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A filter structure for chemical solution used in manufacturing an integrated circuit, the filter structure comprising:
    a first membrane structure comprising a plurality of membrane units, each comprising a cathode comprising a plurality of first openings, an anode comprising a plurality of second openings, and an insulating layer between the cathode and the anode; and
    a filter housing configured to receive the first membrane structure therein, the filter housing comprising an inlet through which the chemical solution is introduced and an outlet through which the chemical solution is discharged,
    wherein the first membrane structure is configured such that when an electric field is applied between the cathode and the anode while the chemical solution introduced through the inlet passes through the first membrane structure, impurities having both positively charged particles and negatively charged particles in the chemical solution are trapped in the first membrane structure.

2. The filter structure of claim 1, wherein the insulating layer comprises a plurality of third openings and electrically separates the cathode from the anode.

3. The filter structure of claim 1, further comprising a cathode-field conductor connected to the cathode, and an anode-field conductor connected to the anode,
    wherein the cathode-field conductor and the anode-field conductor are electrically connected to a voltage supply arranged outside the filter housing, and are configured to apply the electric field between the cathode and the anode by using a voltage provided from the voltage supply, and
    wherein the voltage supply is configured to generate an electric field between the cathode and the anode selectable between 0 to 10 kV/m.

4. The filter structure of claim 1, further comprising a polymer membrane received inside the filter housing and comprising a plurality of pores,
    wherein the polymer membrane is configured such that impurities each having a particle size larger than a particle size of each of the positively charged and the negatively charged particles in the chemical solution are filtered by the polymer membrane while the chemical solution introduced through the inlet passes through the polymer membrane.

5. The filter structure of claim 4, wherein the first membrane structure has a hollow cylindrical shape, and the polymer membrane is arranged on an inner wall of the first membrane structure,
    wherein the polymer membrane includes an organic polymeric material selected from polyethylene (PE), polytetrafluoroethylene PTFE, polyvinylidene fluoride (PVDF), nylon, polypropylene (PP), polyester, polycarbonate, polyethersulfone, cellulose acetate, or polyimide.

6. The filter structure of claim 5, wherein the first membrane structure is spaced apart from an inner wall of the filter housing, and an inlet portion is defined between an outer wall of the first membrane structure and the inner wall of the filter housing, and
    the polymer membrane has a hollow cylindrical shape, and an outlet portion is defined in a space surrounded by an inner wall of the polymer membrane.

7. The filter structure of claim 6, wherein the inlet, the inlet portion, the outlet, and the outlet portion are configured such that the chemical solution introduced from the inlet to the inlet portion sequentially passes through the first membrane structure and the polymer membrane, and is discharged to the outlet through the outlet portion.

8. The filter structure of claim 5, wherein the first membrane structure contacts an inner wall of the filter housing,
    wherein the polymer membrane has a hollow cylindrical shape, and
    wherein the chemical solution, which has been introduced from the inlet, passes through the first membrane structure in a lengthwise direction of the filter housing.

9. The filter structure of claim 4, wherein the polymer membrane has a hollow cylindrical shape, and the first membrane structure is arranged on an inner wall of the polymer membrane.

10. The filter structure of claim 9, wherein the polymer membrane is spaced apart from an inner wall of the filter housing, and an inlet portion is defined between an outer wall of the polymer membrane and the inner wall of the filter housing, and
    the first membrane structure has a hollow cylindrical shape, and an outlet portion is defined in a space surrounded by an inner wall of the first membrane structure.

11. The filter structure of claim 10, wherein the inlet, the inlet portion, the outlet, and the outlet portion are configured such that the chemical solution introduced from the inlet to the inlet portion sequentially passes through the polymer membrane and the first membrane structure, and is discharged to the outlet through the outlet portion.

12. The filter structure of claim 9, wherein the first membrane structure has a cylindrical shape and is configured such that the chemical solution, which has passed through the polymer membrane, passes through the first membrane structure in a lengthwise direction of the filter housing, and is discharged to the outlet.

13. An apparatus for supplying chemical solution comprising a first filter structure, the first filter structure comprising:
    a first filter housing comprising an inlet through which the chemical solution is introduced and an outlet through which the chemical solution is discharged; and
    a first membrane structure received inside the first filter housing,
    wherein the first membrane structure comprises a plurality of membrane units, each comprising a cathode, an anode, and an insulating layer between the cathode and the anode, the insulating layer being configured to electrically separate the cathode from the anode, and
    wherein the first membrane structure is configured such that when an electric field is applied between the cathode and the anode while the chemical solution introduced through the inlet passes through the first membrane structure, impurities having charged particles in the chemical solution are trapped in the first membrane structure.

14. The apparatus of claim 13, wherein the cathode comprises a plurality of first openings, the anode comprises a plurality of second openings, and the insulating layer comprises a plurality of third openings, and
    the first membrane structure is configured such that when the electric field is applied between the cathode and the anode while the chemical solution introduced through the inlet passes through the plurality of first openings, the plurality of second openings, and the plurality of third openings, impurities having the charged particles in the chemical solution are trapped in the first membrane structure, and
    wherein the electric field between the cathode and the anode is selectable between 0 to 10 kV/m.

15. The apparatus of claim 13, wherein the first filter structure further comprises a polymer membrane received in the first filter housing and comprising a plurality of pores, and
    the polymer membrane is configured such that impurities each having a particle size larger than a particle size of each of the charged particles in the chemical solution are filtered by the polymer membrane while the chemical solution introduced through the inlet passes through the polymer membrane.

16. The apparatus of claim 15, wherein the first membrane structure has a hollow cylindrical shape, and the polymer membrane is arranged on an inner wall of the first membrane structure.

17. The apparatus of claim 15, wherein the polymer membrane has a hollow cylindrical shape, and the first membrane structure is arranged on an inner wall of the polymer membrane.

18. The apparatus of claim 13, further comprising:
    a second filter housing comprising an inlet through which the chemical solution is introduced and an outlet through which the chemical solution is discharged; and
    a second filter structure comprising a polymer membrane received in the second filter housing and comprising a plurality of pores,
    wherein the polymer membrane is configured such that impurity particles each having a size larger than a size of each of the plurality of pores are filtered by the polymer membrane while the chemical solution introduced through the inlet passes through the polymer membrane.

19. An apparatus for supplying chemical solution comprising a filter structure, the filter structure comprising:
    a filter housing comprising an inlet through which the chemical solution is introduced and an outlet through which the chemical solution is discharged;
    an electric field membrane structure received inside the filter housing; and
    a polymer membrane received inside the filter housing and comprising a plurality of pores,
    wherein the electric field membrane structure comprises a plurality of electric field membrane units, each comprising a cathode comprising a plurality of first openings, an anode comprising a plurality of second openings, and an insulating layer between the cathode and the anode, the insulating layer electrically separating the cathode from the anode and comprising a plurality of third openings.

20. The apparatus of claim 19, wherein the electric field membrane structure is configured such that when an electric field is applied between the cathode and the anode while the chemical solution introduced through the inlet passes through the electric field membrane structure, first impurity particles in the chemical solution are trapped in the electric field membrane structure,
    the polymer membrane is configured such that second impurity particles in the chemical solution are filtered by the polymer membrane while the chemical solution passes through the polymer membrane,
    the first impurity particles have a particle size less than a size of a chemical material in the chemical solution, and the first impurity particles comprise charged particles, and
    the second impurity particles have a particle size greater than the size of the chemical material in the chemical solution.

* * * * *